United States Patent
Jeon et al.

(10) Patent No.: US 9,245,787 B2
(45) Date of Patent: Jan. 26, 2016

(54) APPARATUS OF MANUFACTURING SEMICONDUCTOR PACKAGES AND METHODS OF MANUFACTURING SEMICONDUCTOR PACKAGES USING THE SAME

(75) Inventors: Chang-Seong Jeon, Hwaseong-si (KR); Sangwook Park, Hwaseong-si (KR); TeakHoon Lee, Hwaseong-si (KR); Ilyoung Han, Uiwang-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 860 days.

(21) Appl. No.: 13/495,837

(22) Filed: Jun. 13, 2012

(65) Prior Publication Data

US 2012/0313332 A1 Dec. 13, 2012

(30) Foreign Application Priority Data

Jun. 13, 2011 (KR) ........................ 10-2011-0056991

(51) Int. Cl.
*B25B 11/00* (2006.01)
*H01L 21/683* (2006.01)
*H01L 23/00* (2006.01)
*H01L 25/065* (2006.01)

(52) U.S. Cl.
CPC ............ *H01L 21/6838* (2013.01); *H01L 24/75* (2013.01); *H01L 24/97* (2013.01); *H01L 25/0657* (2013.01); *H01L 24/16* (2013.01); *H01L 24/81* (2013.01); *H01L 2224/0401* (2013.01); *H01L 2224/06181* (2013.01); *H01L 2224/131* (2013.01); *H01L 2224/13025* (2013.01); *H01L 2224/14181* (2013.01); *H01L 2224/16145* (2013.01); *H01L 2224/73104* (2013.01); *H01L 2224/7598* (2013.01); *H01L 2224/75315* (2013.01); *H01L 2224/75745* (2013.01); *H01L 2224/94* (2013.01); *H01L 2224/97* (2013.01); *H01L 2924/014* (2013.01); *H01L 2924/01006* (2013.01); *Y10T 279/11* (2015.01)

(58) Field of Classification Search
CPC ........................................................ B25B 11/005
USPC ..................................... 279/3; 269/289 R, 21
See application file for complete search history.

(56) References Cited

U.S. PATENT DOCUMENTS

| | | | | | |
|---|---|---|---|---|---|
| 2,133,518 | A | * | 10/1938 | Huebner | 248/363 |
| 3,212,497 | A | * | 10/1965 | Dickinson | 602/6 |
| 3,520,055 | A | * | 7/1970 | Jannett | 29/830 |
| 3,762,404 | A | * | 10/1973 | Sakita | 602/6 |

(Continued)

FOREIGN PATENT DOCUMENTS

| | | |
|---|---|---|
| JP | 2007-027549 | 2/2007 |
| KR | 100186517 B1 | 12/1997 |

(Continued)

*Primary Examiner* — Lee D Wilson
*Assistant Examiner* — Jamal Daniel
(74) *Attorney, Agent, or Firm* — F. Chau & Associates, LLC

(57) ABSTRACT

Apparatuses of manufacturing semiconductor packages are provided. An apparatus includes a chuck having a body, a porous plate disposed on the body, and a buffer pad disposed on the plate to provide a place on which a plurality of chips are loaded. The buffer pad has elasticity greater than the plate. The apparatus also includes a vacuum part supplying vacuum to the chuck so that the plurality of chips are sucked onto the buffer pad. Methods of manufacturing semiconductor packages using the apparatus are also provided.

18 Claims, 21 Drawing Sheets

(56) References Cited

U.S. PATENT DOCUMENTS

| | | | | |
|---|---|---|---|---|
| 3,830,896 | A * | 8/1974 | Flicker et al. | 64/45.2 |
| 4,410,168 | A * | 10/1983 | Gotman | 269/21 |
| 4,667,944 | A * | 5/1987 | Althouse | 269/21 |
| 4,778,326 | A * | 10/1988 | Althouse et al. | 414/800 |
| 6,150,240 | A * | 11/2000 | Lee et al. | 438/460 |
| 6,254,959 | B1 * | 7/2001 | Hirano et al. | 428/71 |
| 6,271,503 | B1 * | 8/2001 | Hall et al. | 219/444.1 |
| 6,318,372 | B1 * | 11/2001 | Hiebert | 128/869 |
| 6,367,635 | B1 * | 4/2002 | Auer | 211/41.18 |
| 6,444,492 | B1 * | 9/2002 | Ohta | 438/108 |
| 6,505,395 | B1 * | 1/2003 | Farnworth et al. | 29/559 |
| 6,524,351 | B2 * | 2/2003 | Ohta | 29/25.01 |
| 6,541,989 | B1 * | 4/2003 | Norris et al. | 324/754.03 |
| 6,709,617 | B2 * | 3/2004 | Wu | 264/222 |
| 6,751,853 | B2 * | 6/2004 | Farnworth et al. | 29/743 |
| 7,214,563 | B2 | 5/2007 | Ishikawa et al. | |
| 7,223,319 | B2 * | 5/2007 | Kurosawa et al. | 156/716 |
| 7,306,695 | B2 * | 12/2007 | Kasai | 156/702 |
| 7,527,271 | B2 * | 5/2009 | Oh et al. | 279/3 |
| 7,731,166 | B2 * | 6/2010 | Kaiser et al. | 269/21 |
| 8,157,307 | B2 * | 4/2012 | Thallner | 294/212 |
| 8,714,611 | B2 * | 5/2014 | Brandstatter et al. | 294/212 |
| 8,894,054 | B2 * | 11/2014 | Jacob et al. | 269/21 |
| 2013/0133838 | A1 * | 5/2013 | Kim | 156/707 |
| 2015/0013514 | A1 * | 1/2015 | Strauss | 83/29 |

FOREIGN PATENT DOCUMENTS

| | | |
|---|---|---|
| KR | 1020070115835 A | 12/2007 |
| KR | 1020100036774 A | 4/2010 |

* cited by examiner

APPARATUS OF MANUFACTURING SEMICONDUCTOR PACKAGES AND METHODS OF MANUFACTURING SEMICONDUCTOR PACKAGES USING THE SAME

CROSS-REFERENCE TO RELATED APPLICATIONS

This U.S. non-provisional patent application claims priority under 35 U.S.C. §119 to Korean Patent Application No. 10-2011-0056991, filed on Jun. 13, 2011, the entirety of which is incorporated by reference herein.

TECHNICAL FIELD

Embodiments of the present disclosure herein relate to apparatuses and methods of manufacturing semiconductor packages, and more particularly to semiconductor manufacturing apparatuses of supporting and transferring a plurality of chips and methods of manufacturing semiconductor packages using the apparatuses.

DISCUSSION OF RELATED ART

For more compact semiconductor packages, semiconductor chips may be stacked in multiple layers. However, when a second layer of semiconductor chips are stacked on a first layer of semiconductor chips, the first layer of semiconductor chips may laterally slip and be thus damaged or broken.

SUMMARY

Exemplary embodiments are directed to apparatuses of manufacturing semiconductor packages and methods of manufacturing semiconductor packages using the apparatuses.

In an exemplary embodiment, the apparatus includes a chuck and a vacuum part which vacuumizes the chuck. The chuck includes a body, a porous plate disposed on the body, and a buffer pad disposed on the plate to provide a place on which a plurality of chips are loaded. The buffer pad has elasticity greater than the plate. The plurality of chips are sucked onto the buffer pad while the vacuum part vacuumizes the chuck.

In an embodiment, the body includes an upper portion having a groove in which the plate and the buffer pad are sequentially stacked, and a lower portion downwardly extending from the upper portion.

In an embodiment, the buffer pad includes a plurality of line-shaped patterns which are parallel with each other.

In an embodiment, the buffer pad includes first line-shaped patterns, which extend in a first direction and are parallel with each other, and second line-shaped patterns which extend in a second direction and are parallel with each other.

In an embodiment, the buffer pad includes a plurality of patterns respectively corresponding to chip pads or solder balls of the chips.

In an embodiment, the buffer pad includes a heat resistant rubber material or an engineering plastic material, and the porous plate includes an alumina material, a mulite material, a ceramic material or a silicon carbide material.

In an embodiment, the apparatus further includes a driving part for moving the chuck and a heating part disposed in the chuck to supply heat to the chips on the chuck.

In an embodiment, the chuck further includes alignment marks on the body.

In an exemplary embodiment, the method includes loading first chips at predetermined positions, respectively, on a head, sucking the first chips onto the head, moving the head with the first chips so that the first chips contact second chips, and pressing and heating the first chips on the second chips to bond the first chips to the second chips. The head includes a chuck and a vacuum part connected to the chuck. The chuck includes a body, a porous plate disposed on the body, and a buffer pad disposed on the plate to provide a place on which a plurality of chips are loaded. The vacuum part generates a vacuum so that the plurality of chips are sucked onto the buffer pad. The buffer pad is formed of an elastic material having elasticity greater than the plate.

In an embodiment, the method further includes sucking the second chips at predetermined positions, respectively, onto a stage. Coordinates of the predetermined positions on the head are identical to coordinates of the predetermined positions on the stage. The stage includes a chuck and a vacuum part connected to the chuck. The chuck of the stage includes a body, a porous plate disposed on the body, and a buffer pad disposed on the plate to provide a place on which a plurality of chips are loaded. The vacuum part of the stage generates a vacuum so that the plurality of chips are sucked onto the buffer pad. The buffer pad is formed of an elastic material having elasticity greater than the plate.

In an embodiment, loading the first chips at predetermined positions on the head includes sawing at least one substrate including the first chips to separate the first chips and selecting normally operating chips from the first chips.

In an embodiment, the method further includes flipping the selected chips, after selecting the good chips from the first chips.

In an embodiment, the first chips include at least two different chips having different functions from each other.

In an embodiment, the method further includes forming an under-fill material covering the first chips, after sawing the at least one substrate including the first chips.

In an embodiment, the method further includes forming an under-fill material filling spaces between the second chips as well as spaces between the first and second chips, after pressing and heating the first chips on the second chips to bond the first chips to the second chips.

BRIEF DESCRIPTION OF THE DRAWINGS

The embodiments of the inventive concept will become more apparent in view of the attached drawings and accompanying detailed description, wherein.

DETAILED DESCRIPTION OF THE EMBODIMENTS

Figure 1A:
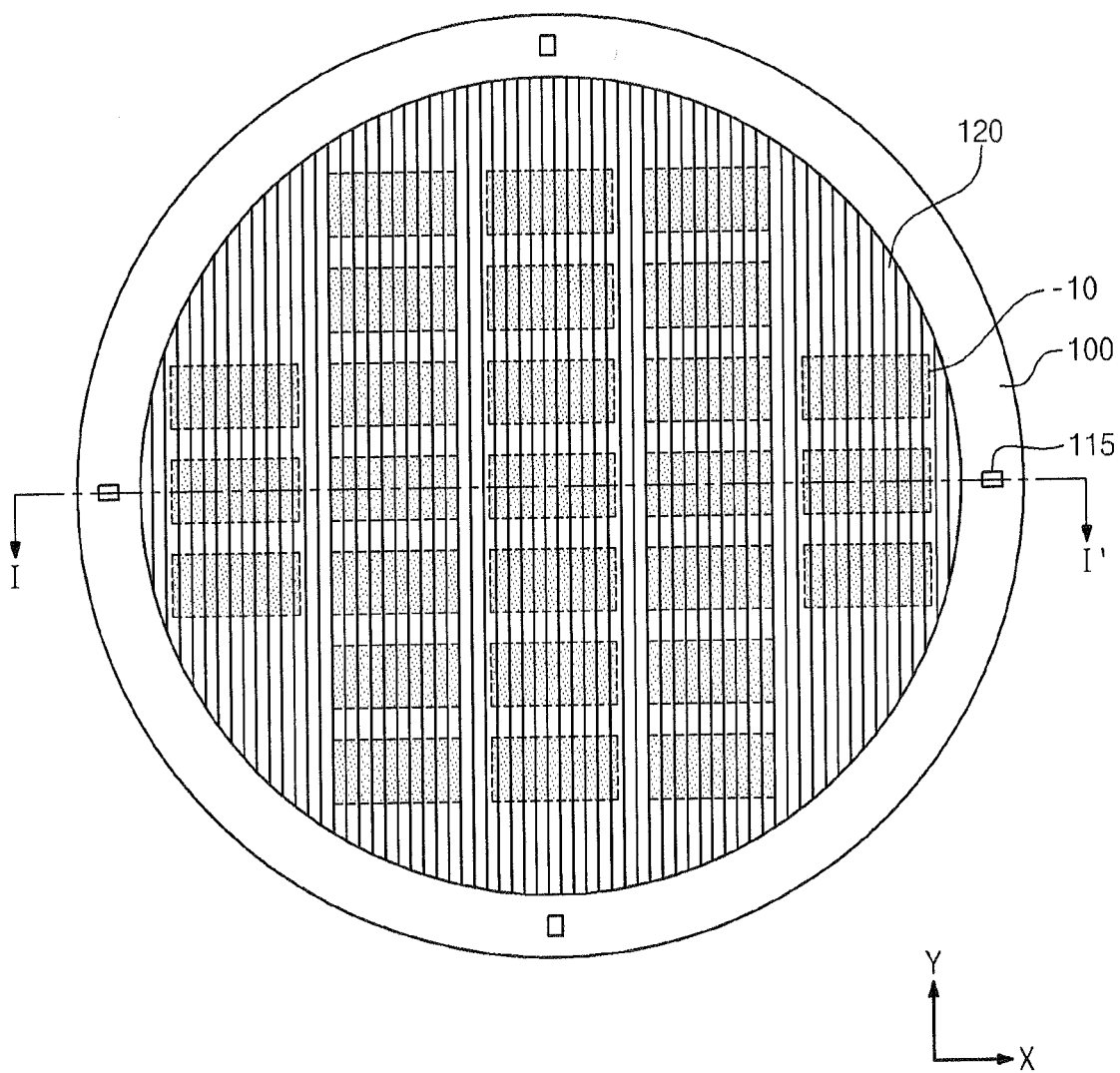
FIG. 1A is a plan view illustrating an apparatus according to an embodiment.

The embodiments of the inventive concept will be described in more detail with reference to the accompanying drawings, wherein the same reference numerals may be used to denote the same or substantially the same elements throughout the specification and the drawings. It should be noted, however, that the inventive concept is not limited to the following exemplary embodiments, and may be implemented in various forms.

In the present specification, it will be understood that when an element such as a layer, region or substrate is referred to as being "on" another element, it can be directly on the other element or intervening elements may be present. In the drawings, embodiments of the inventive concept are not limited to the specific examples provided herein and are exaggerated for clarity.

As used herein, the singular terms "a," "an" and "the" are intended to include the plural forms as well, unless the context clearly indicates otherwise.

Figure 1B:
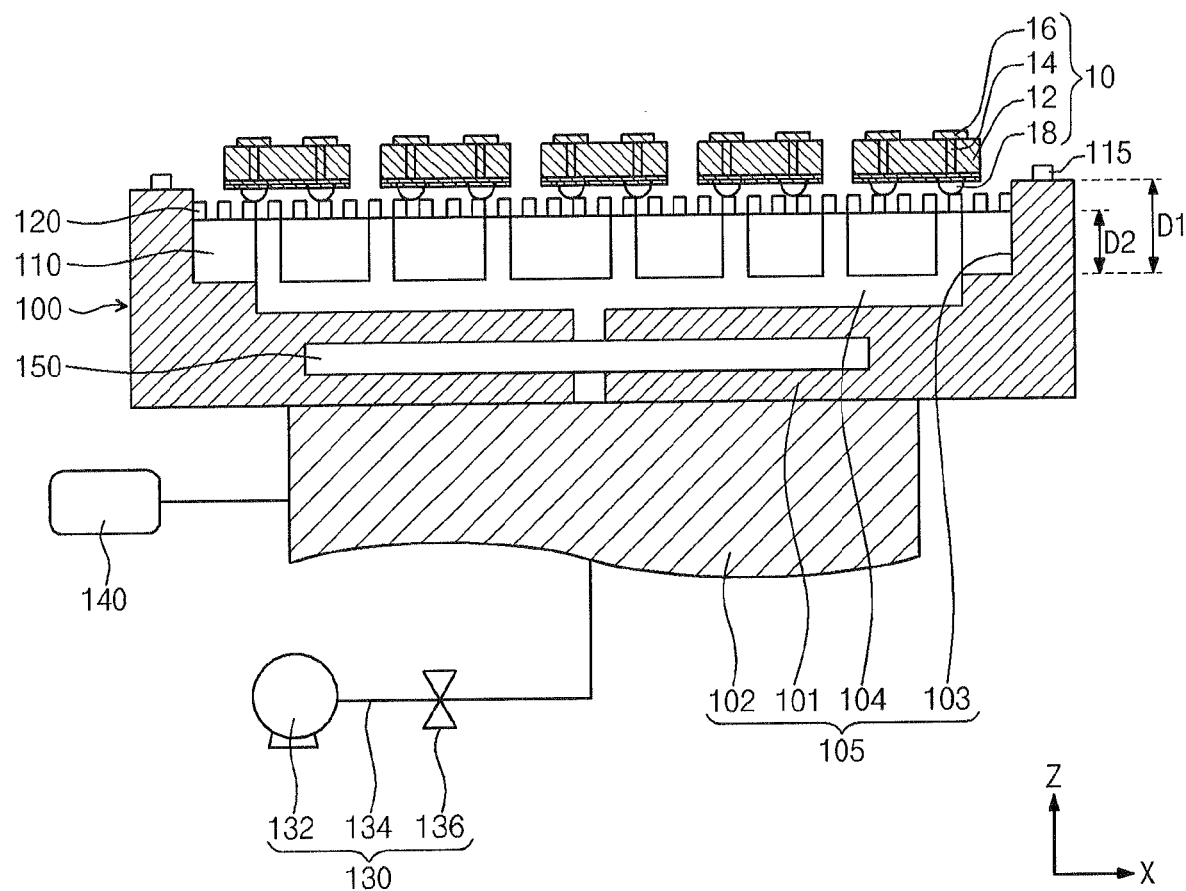
FIG. 1B is a cross sectional view taken along a line I-I' of FIG. 1A.

FIG. 1A is a plan view illustrating an apparatus according to an embodiment of the inventive concept, and FIG. 1B is a cross sectional view taken along a line I-I' of FIG. 1A.

Referring to FIGS. 1A and 1B, an apparatus of manufacturing semiconductor packages includes a chuck 100, a vacuum part 130, a driving part 140 and a heating part 150.

The apparatus functions as a stage onto which a plurality of chips 10 are loaded and sucked or a head that simultaneously moves the plurality of chips. Each of the chips 10 includes a semiconductor chip. The semiconductor chip includes a substrate 12 on which an electrical circuit is formed, through silicon via (TSV) electrodes 14 penetrating the substrate 12, solder balls 18 disposed on a first surface of the substrate 12, and pads 16 disposed on a second surface of the substrate 12 opposite to the first surface. Each of the solder balls 18 has a curved surface, and each of the pads 16 has a polyhedral shape. The chuck 100 includes a body 105, a plate 110 and a buffer pad 120.

The body 105 includes an upper portion 101 and a lower portion 102 downwardly extending from the upper portion 101. A groove 103 is provided in the upper portion 101, and the plate 110 and the buffer pad 120 are inserted into the groove 103. The body 105 includes a plurality of vacuum holes 104 which communicate with the vacuum part 130. Specifically, the vacuum holes 104 communicate with a vacuum line 134 of the vacuum part 130. Alignment marks 115 are provided at edges of the body 105. The alignment marks 115 enable the chips 10 to be loaded at predetermined positions, respectively, on the buffer pad 120.

The plate 110 is fixed in the groove 105. The plate 110 has a disk shape. The upper portion 101 of the body 105 and the plate 110 have the same or substantially the same central point in a plan view. A thickness D2 of the plate 110 is substantially less than a depth D1 of the groove 103 of the body 105. In an embodiment, the plate 110 includes a porous material, such as alumina, mulite, ceramic, or silicon carbide. The mulite includes $3Al_2O_32SiO_2$ or $2Al_2O_3SiO_2$.

The buffer pad 120 is detachably disposed on the plate 110. For example, the buffer pad 120 can be attached to or detached from the plate 120. The buffer pad 120 is disposed in the groove 103.

In an embodiment, the buffer pad 120 includes a material having elasticity which is greater than elasticity of the plate 110. For example, according to an embodiment, the buffer pad 120 includes Teflon™ (a trademark of DuPont Company), a heat resistant rubber material or an engineering plastic material. For example, according to an embodiment, the buffer pad 120 includes an engineering plastic material with excellent mechanical and thermal characteristics, such as polycarbonate having high shock resistance or polyamide having high wear resistance. For example, according to an embodiment, the engineering plastic material includes acrylonitrile butadiene styrene (ABS), polycarbonates (PC), polyamides (PA), polybutylene terephthalate (PBT), polyethylene terephthalate (PET), polyphenylene oxide (PPO), polysulphone (PSU), polyetherketone (PEK), polyetheretherketone (PEEK), polyimides, polyphenylene sulfide (PPS), polyoxymethylene plastic (POM), polyacrylic acid (PAA), cross-linked polyethylene (PEX or XLPE), polyethylene (PE), polyethylene terephthalate (PET or PETE), polyphenyl ether (PPE), polyvinyl chloride (PVC), polyvinylidene chloride (PVDC), polylactic acid (PLA), polypropylene (PP), polybutylene (PB), polybutylene terephthalate (PBT), polyimide (PI), polycarbonate (PC), polytetrafluoroethylene (PTFE), polystyrene (PS), polyurethane (PU), polyester (PEs) or poly(methyl methacrylate) (PMMA).

In an embodiment, the buffer pad 120 has a certain shape. For example, according to an embodiment, the buffer pad 120 includes a plurality of lines that extend in a direction and are parallel with each other.

The buffer pad 120 directly contacts the plurality of chips 10 which are loaded on the chuck 100. As described above, the buffer pad 120 includes a flexible material. As a result, the buffer pad 120 protects the plurality of chips 10 while the chips 10 are adhered onto the chuck 100, e.g., in a vacuum. Since the buffer pad 120 contacting the chips 10 includes line-shaped patterns, the vacuum part 130 produces a higher vacuum between the buffer pad 120 and the chips 10. According to an embodiment, the buffer pad 120 communicates with the vacuum holes 104. For example, according to an embodiment, a vacuum is created in the vacuum holes 104, thereby resulting in the chips 10 being sucked onto the buffer pad 120.

The vacuum part 130 is connected to the chuck 100. The vacuum part 130 includes a vacuum pump 132 which produces a vacuum, a vacuum line 134 which connects the vacuum pump 132 to the chuck 100, and a control valve 136 provided in the vacuum line 134.

The driving part 140 is connected to the chuck 100. With the chips 10 sucked onto the chuck 100, the chuck 100 is moved along an X-axis, a Y-axis or a Z-axis. According to an embodiment, the apparatus is used as a stage on which the chips 10 are temporarily loaded or as a head that simultaneously moves the chips 10 according to operation of the driving part 140. For example, according to an embodiment, when the chuck 100 can be moved along the X-axis, the Y-axis or the Z-axis under the control of the driving part 140, the apparatus is used as the stage. Alternatively, when the chuck 100 can flip over as well as moving along the X-axis, the Y-axis or the Z-axis under the control of the driving part 140, the apparatus is used as the head.

The heating part 150 is disposed in the chuck 100. The heating part 150 melts the pads 16 and the solder balls 18 of the chips 10 loaded on the chuck 100. The heating part 150 includes heating coils.

Figure 2:
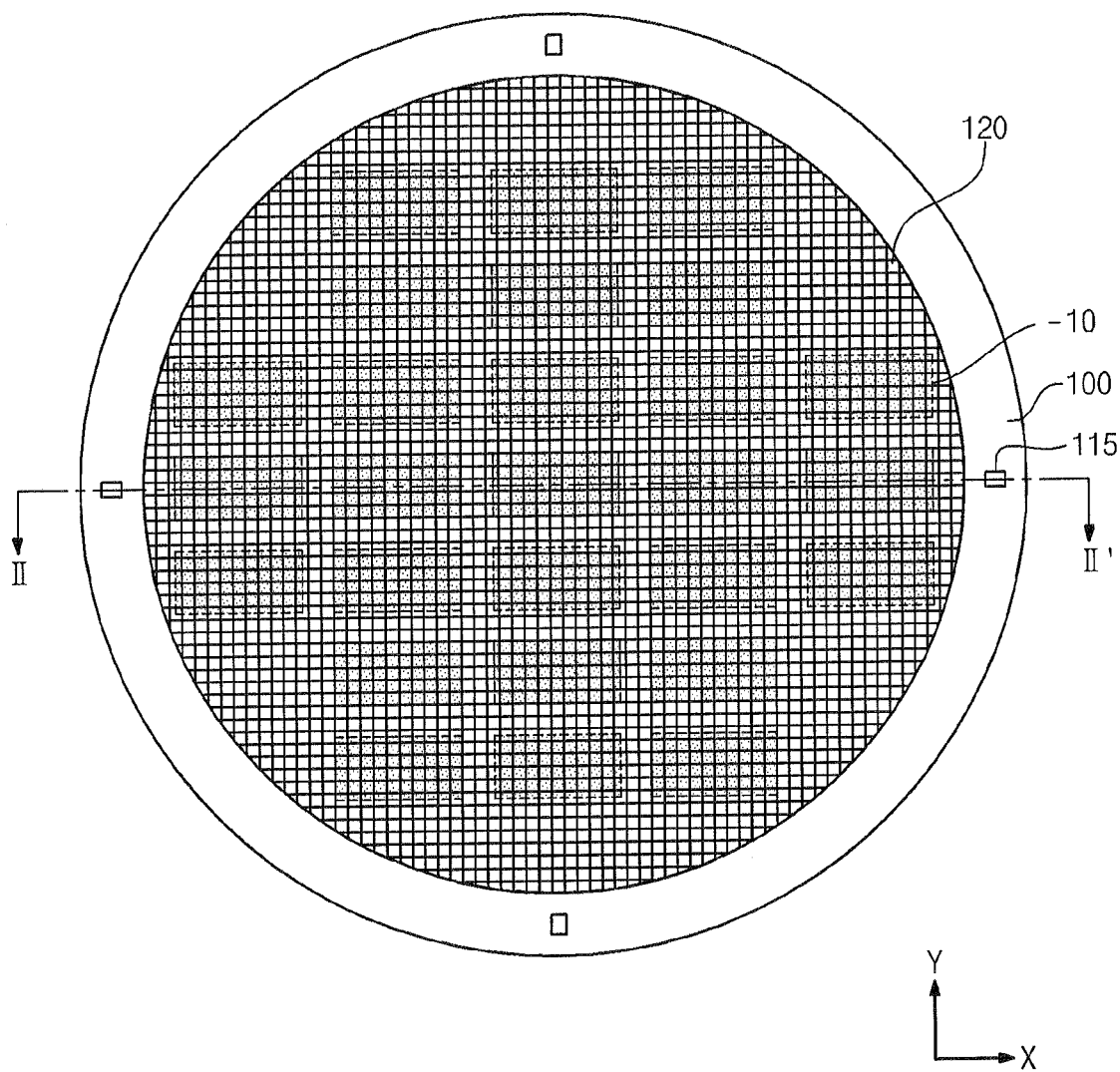
FIG. 2 is a plan view illustrating an apparatus according to an embodiment.

FIG. 2 is a plan view illustrating an apparatus according to an embodiment of the inventive concept. A cross sectional view taken along a line II-II' of FIG. 2 is the same or substantially identical to FIG. 1B.

Referring to FIGS. 2 and 1B, the apparatus includes a chuck 100, a vacuum part 130, a driving part 140 and a heating part 150. The chuck 100 further includes a body 105, a plate 110 and a buffer pad 120.

The buffer pad 120 has a certain shape. In an embodiment, the buffer pad 120 includes a plurality of first parallel lines extending in a first direction and a plurality of second parallel lines extending in a second direction and crossing the first lines. As a consequence, the buffer pad 120 has a grid shape. According to an embodiment, the first direction is perpendicular to the second direction. Alternatively, the buffer pad 120 has a mesh shape.

The buffer pad 120 includes a material having elasticity which is greater than elasticity of the plate 110. In an embodiment, the buffer pad 120 includes Teflon™, a heat resistant rubber material or an engineering plastic material.

According to an embodiment, the buffer pad 120 includes a flexible and/or elastic material, so that the buffer pad 120 may protect the plurality of chips 10 while the chips 10 are adhered to the chuck 100, e.g., in a vacuum. Since the buffer pad 120 contacting the chips 10 has a grid-shaped pattern or a mesh-shaped pattern, the vacuum part 130 may produce a higher vacuum between the buffer pad 120 and the chips 10.

According to an embodiment, the chuck 100, the vacuum part 130, the driving part 140 and the heating part 150 have the same or substantially the same configurations as those described with reference to FIGS. 1A and 1B.

Figure 3A:
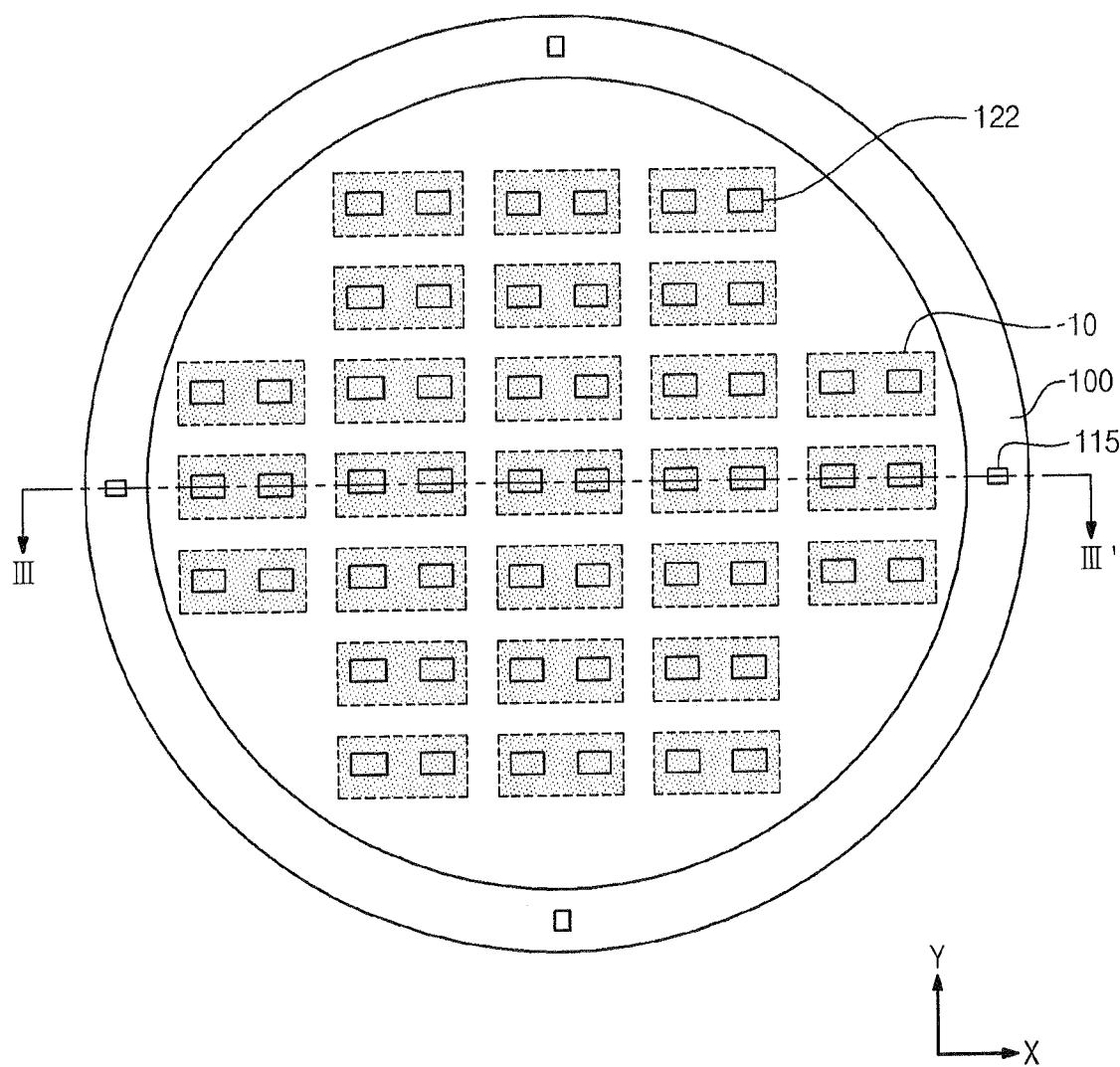
FIG. 3A is a plan view illustrating an apparatus according to an embodiment.
Figure 3B:
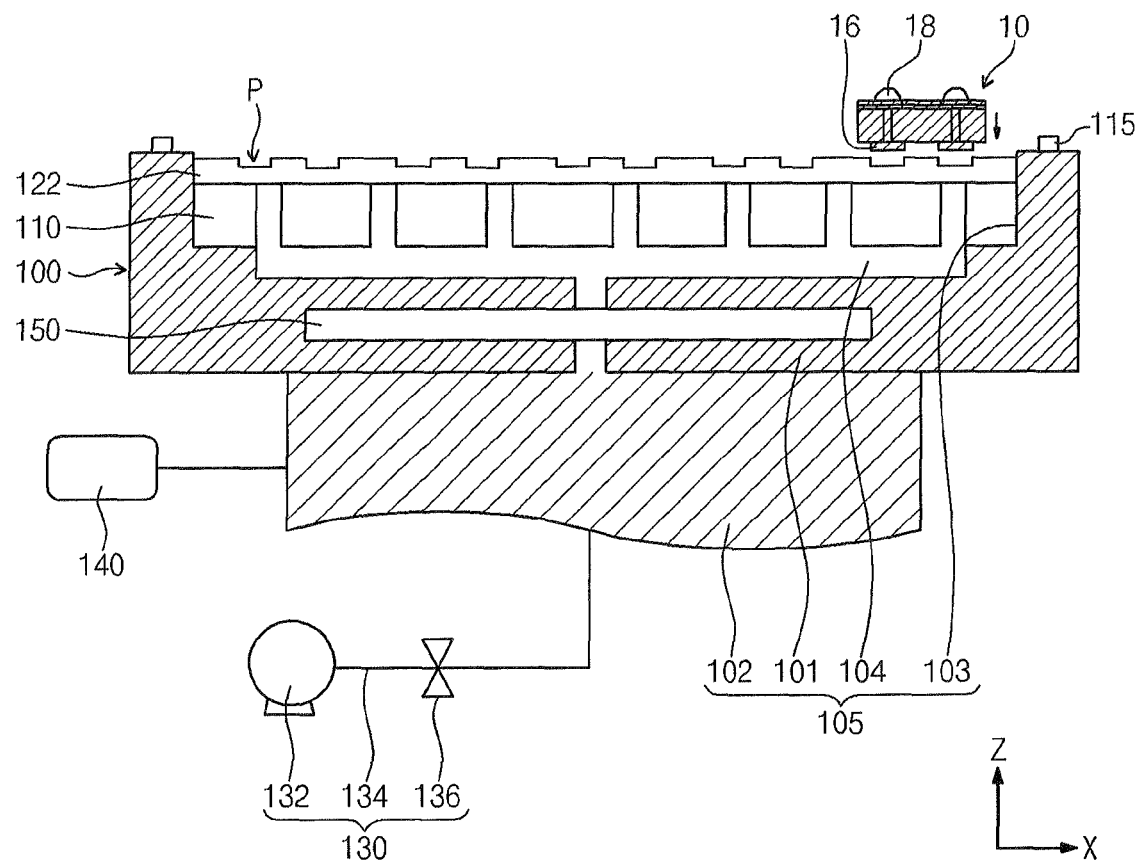
FIG. 3B is a cross sectional view taken along a line III-III' of FIG. 3A.

FIG. 3A is a plan view illustrating an apparatus according to an embodiment of the inventive concept, and FIG. 3B is a cross sectional view taken along a line III-III' of FIG. 3A.

Referring to FIGS. 3A and 3B, the apparatus includes a chuck 100, a vacuum part 130, a driving part 140 and a heating part 150. The chuck 100 also includes a body 105, a plate 110 and a buffer pad 122.

The chips 10 loaded on the buffer pad 122 include semiconductor chips. Each semiconductor chip includes a substrate 12 on which an electrical circuit is formed, through silicon via (TSV) electrodes 14 penetrating the substrate 12, solder balls 18 disposed on a first surface of the substrate 12 and pads 16 disposed on a second surface of the substrate 12 opposite to the first surface. Each of the solder balls 18 has a curved surface, and each of the pads 16 has a polyhedral shape.

In an embodiment, the buffer pad 122 has a plurality of patterns P respectively corresponding to the pads 16 of the chips 10. For example, when each pad 16 has a protruding shape, a corresponding pattern P of the pad has a recessed region into which the pad 16 is inserted when the chips 10 are loaded onto the chuck 100. When each pad 16 has a polyhedral shape, a pattern P corresponding to the pad has a polyhedral space.

The buffer pad 122 includes a material having elasticity which is greater than elasticity of the plate 110. In an embodiment, the buffer pad 122 includes Teflon™, a heat resistant rubber material or an engineering plastic material.

According to an embodiment, the buffer pad 122 includes a flexible or elastic material, so that the buffer pad 122 may protect the plurality of chips 10 while the chips 10 are adhered to the chuck 100, e.g., in a vacuum. Since the buffer pad 122 contacting the chips 10 has the patterns P respectively corresponding to the pads 16 of the chips 10, the vacuum part 130 may produce a higher vacuum between the buffer pad 122 and the chips 10.

The chuck 100, the vacuum part 130, the driving part 140 and the heating part 150 have the same or substantially the same configurations as those described with reference to FIGS. 1A and 1B.

Figure 4A:
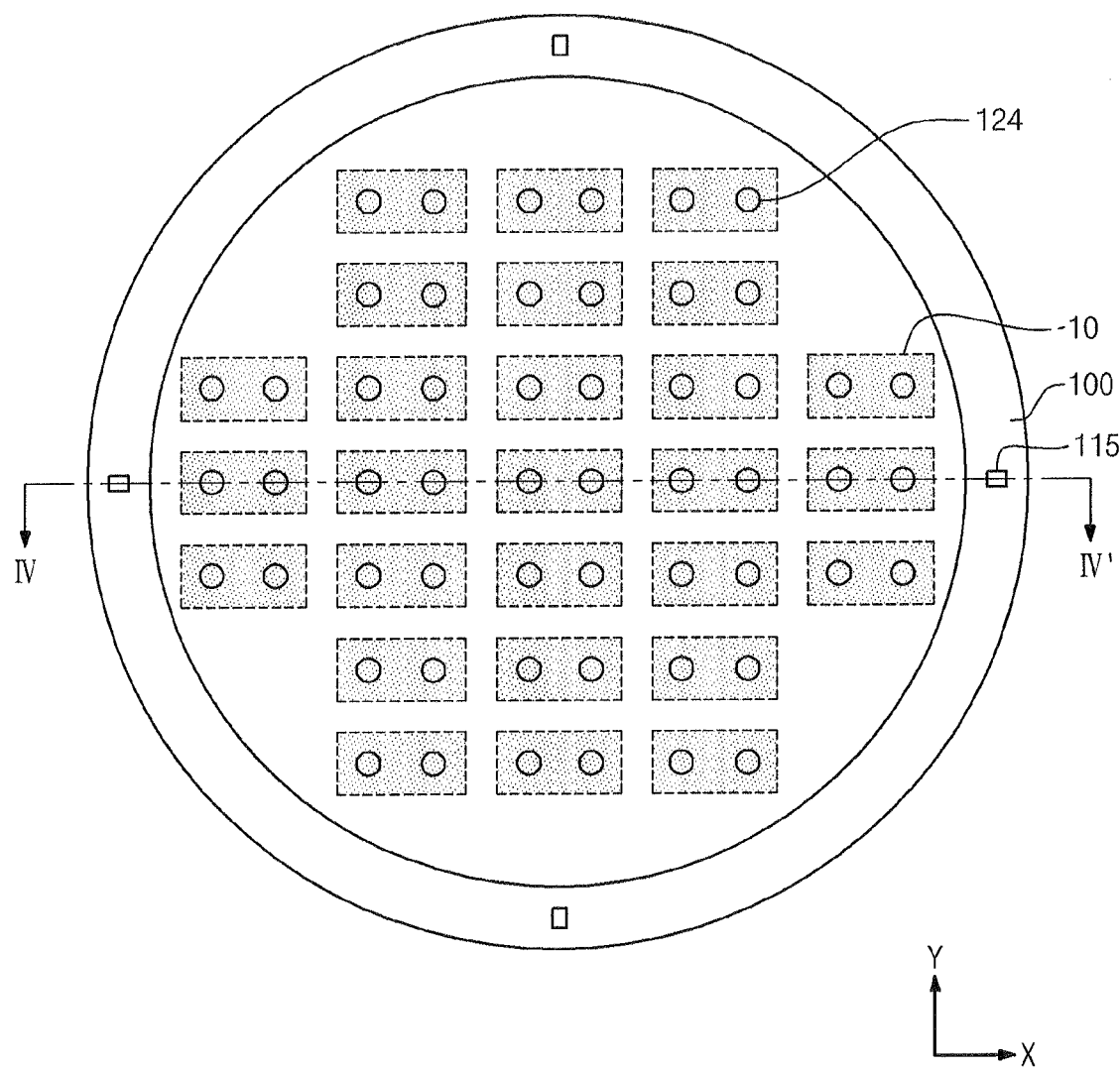
FIG. 4A is a plan view illustrating an apparatus according to an embodiment.
Figure 4B:
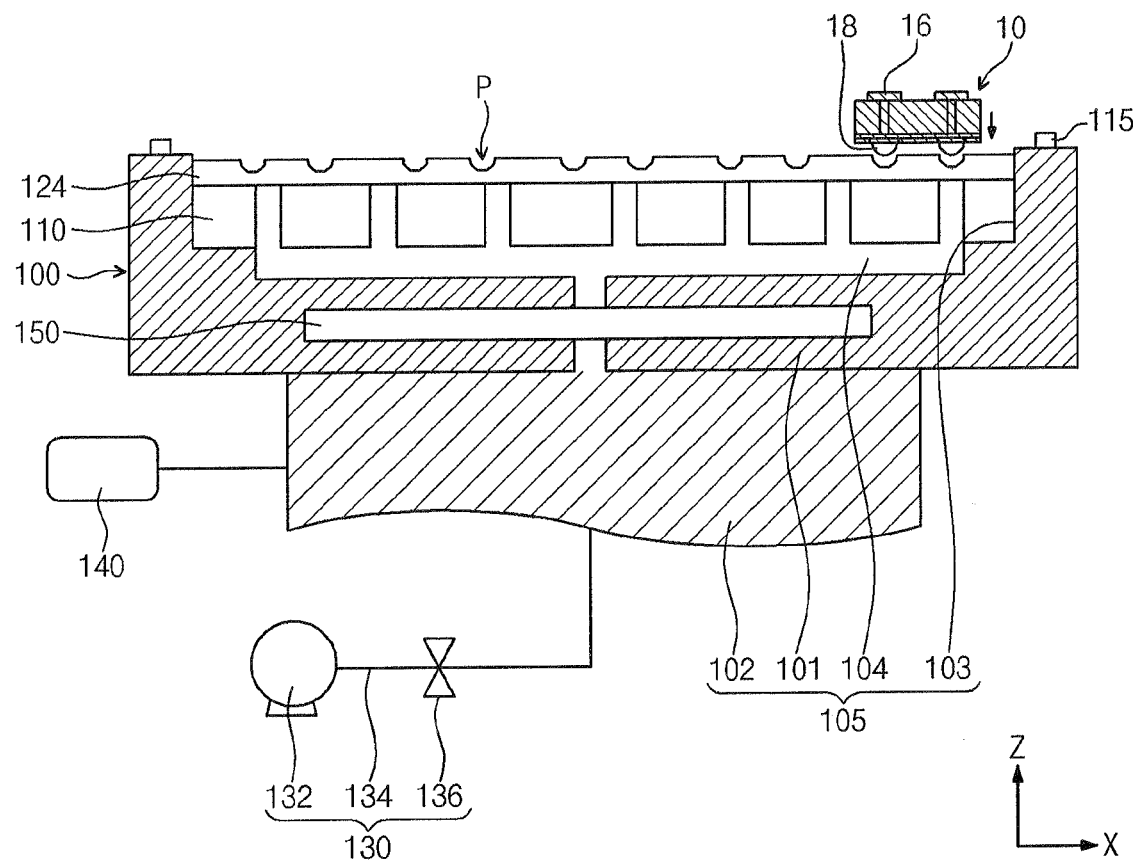
FIG. 4B is a cross sectional view taken along a line IV-IV' of FIG. 4A.

FIG. 4A is a plan view illustrating an apparatus according to an embodiment of the inventive concept, and FIG. 4B is a cross sectional view taken along a line IV-IV' of FIG. 4A.

Referring to FIGS. 4A and 4B, the apparatus includes a chuck 100, a vacuum part 130, a driving part 140 and a heating part 150. The chuck 100 includes a body 105, a plate 110 and a buffer pad 124.

The chips 10 loaded on the buffer pad 124 include semiconductor chips. Each semiconductor chip includes a substrate 12 in which an electrical circuit is formed, through silicon via (TSV) electrodes 14 penetrating the substrate 12, solder balls 18 disposed on a first surface of the substrate 12 and pads 16 disposed on a second surface of the substrate 12 opposite to the first surface. Each of the solder balls 18 has a curved surface, and each of the pads 16 has a polyhedral shape.

In an embodiment, the buffer pad 124 has a plurality of patterns P respectively corresponding to the solder balls 18 of the chips 10. For example, when each solder ball 18 has a protruding shape, a pattern P corresponding to the solder ball 18 has a recessed region into which the solder ball 18 is inserted when the chips 10 are loaded onto the chuck 100. When each solder ball 18 has a curved surface as illustrated in FIG. 4B, a pattern P corresponding to the solder ball has a curved bottom surface to combine with the solder ball 18.

The buffer pad 124 includes a material having elasticity which is greater than elasticity of the plate 110. In an embodiment, the buffer pad 124 includes Teflon™, a heat resistant rubber material or an engineering plastic material.

According to an embodiment, the buffer pad 124 includes a flexible or elastic material, so that the buffer pad 124 may protect the plurality of chips 10 while the chips 10 are adhered to the chuck 100, e.g., in a vacuum. Since the buffer pad 124 contacting the chips 10 has the patterns P respectively corresponding to the solder balls 18 of the chips 10, the vacuum part 130 may produce a higher vacuum between the buffer pad 124 and the chips 10.

The chuck 100, the vacuum part 130, the driving part 140 and the heating part 150 have the same or substantially the same configurations as those described with reference to FIGS. 1A, 1B, 3A and 3B.

Methods of forming a semiconductor package are described hereinafter. The semiconductor packages are formed using any one of the apparatuses described with reference to FIGS. 1A, 1B, 2, 3A, 3B, 4A and 4B. The apparatuses illustrated in FIGS. 1A, 1B, 2, 3A, 3B, 4A and 4B function as a stage supporting a plurality of chips 10 or as a head transferring a plurality of chips 10. As used herein, the terms "stage" and "head" may be used to be discerned from each other according to the function.

FIGS. 5A through 5D are cross sectional views illustrating a method of forming a semiconductor package according to an embodiment of the inventive concept.

Figure 5A:
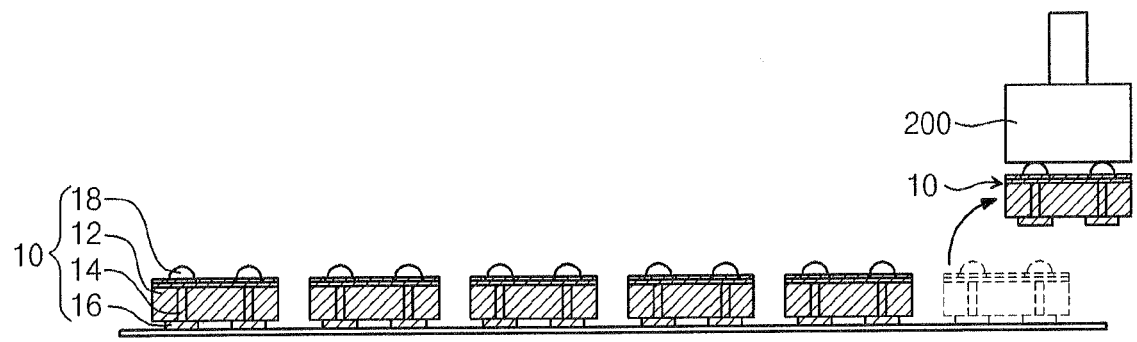
FIGS. 5A and 5D are cross sectional views illustrating a method of packaging a semiconductor device according to an embodiment.

Referring to FIG. 5A, a plurality of first chips 10 are provided, and one of the first chips 10 is sucked onto a transfer unit 200.

Each of the first chips 10 includes a substrate 12 in which an electrical circuit is formed, through silicon via (TSV) electrodes 14 penetrating the substrate 12, first chip pads 16 formed on a first surface of the substrate 12 and first solder balls 18 formed on a second surface of the substrate 12 opposite to the first surface.

In an embodiment, the first chips 10 are separated from a single wafer by a die sawing process. For example, the first chips 10 have the same function. Alternatively, the first chips 10 are separated from at least two different wafers. For example, at least two of the first chips 10 have different functions from each other.

In an embodiment, the first chips 10 may include chips that normally or abnormally operate under an electrical die sorting (EDS) test. According to an embodiment, one of the normally operating chips 10 is selected and sucked onto the transfer unit 200, e.g., by vacuum or static electricity. According to an embodiment, the EDS test is performed prior to the die sawing process.

Figure 5B:
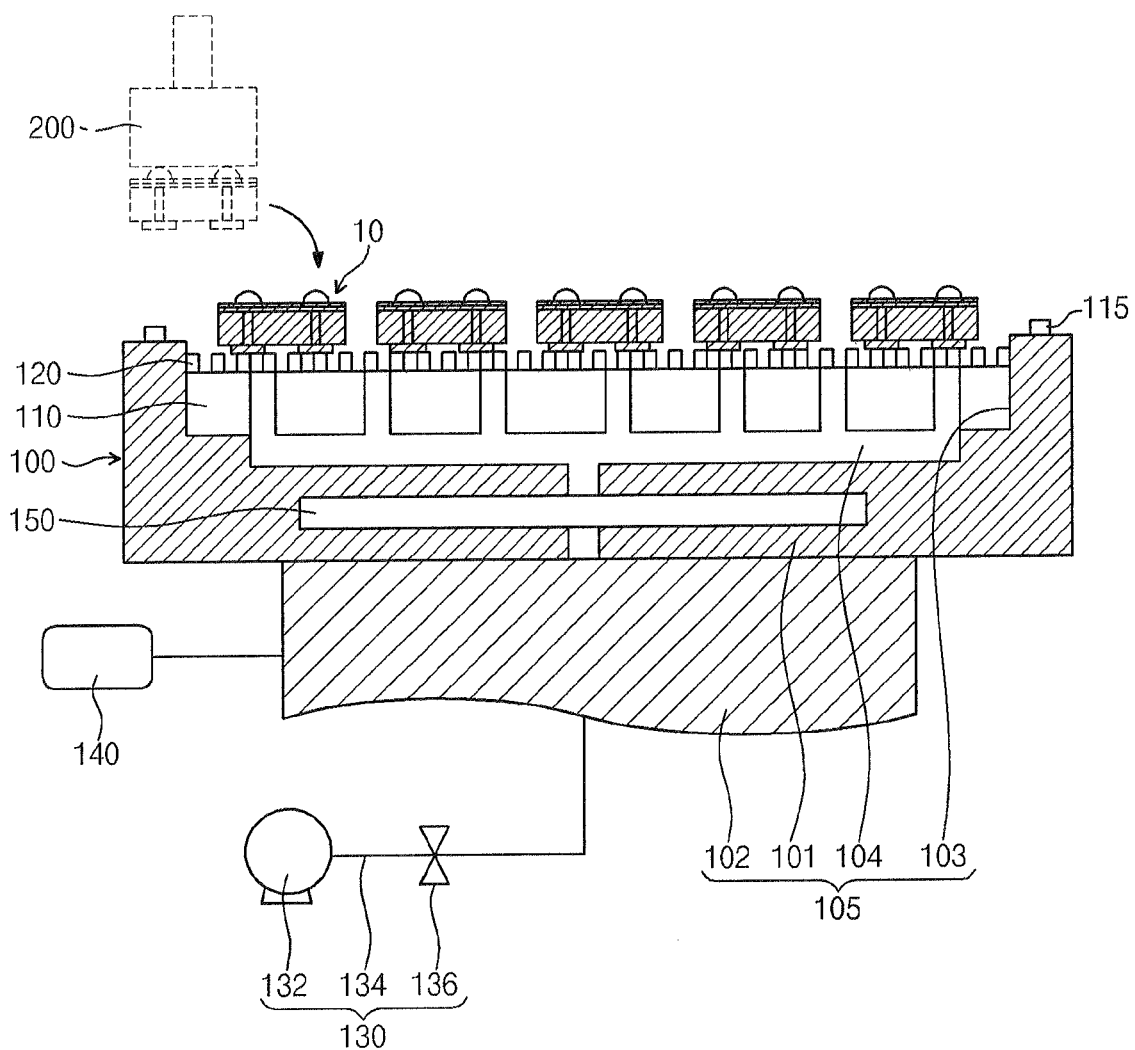

Referring to FIG. 5B, the selected first chip 10 is loaded at a predetermined position on a head by the transfer unit 200.

According to an embodiment, the head has the same or substantially the same structure as the apparatuses described with reference to FIGS. 1A and 1B. However, the embodiments are not limited thereto. According to an embodiment, the apparatuses illustrated in FIGS. 2, 3A, 3B, 4A and 4B is used.

The head includes a chuck 100, a vacuum part 130, a driving part 140 and a heating part 150. The chuck 100 includes a body 105, a plate 110 and a buffer pad 120. According to an embodiment, the chuck 100 further includes alignment marks 115 disposed on edges of the body 105. By the alignment marks 115 and the transfer unit 200, normally operating chips of the first chips 10 are loaded at predetermined positions, respectively, on the head.

Figure 5C:
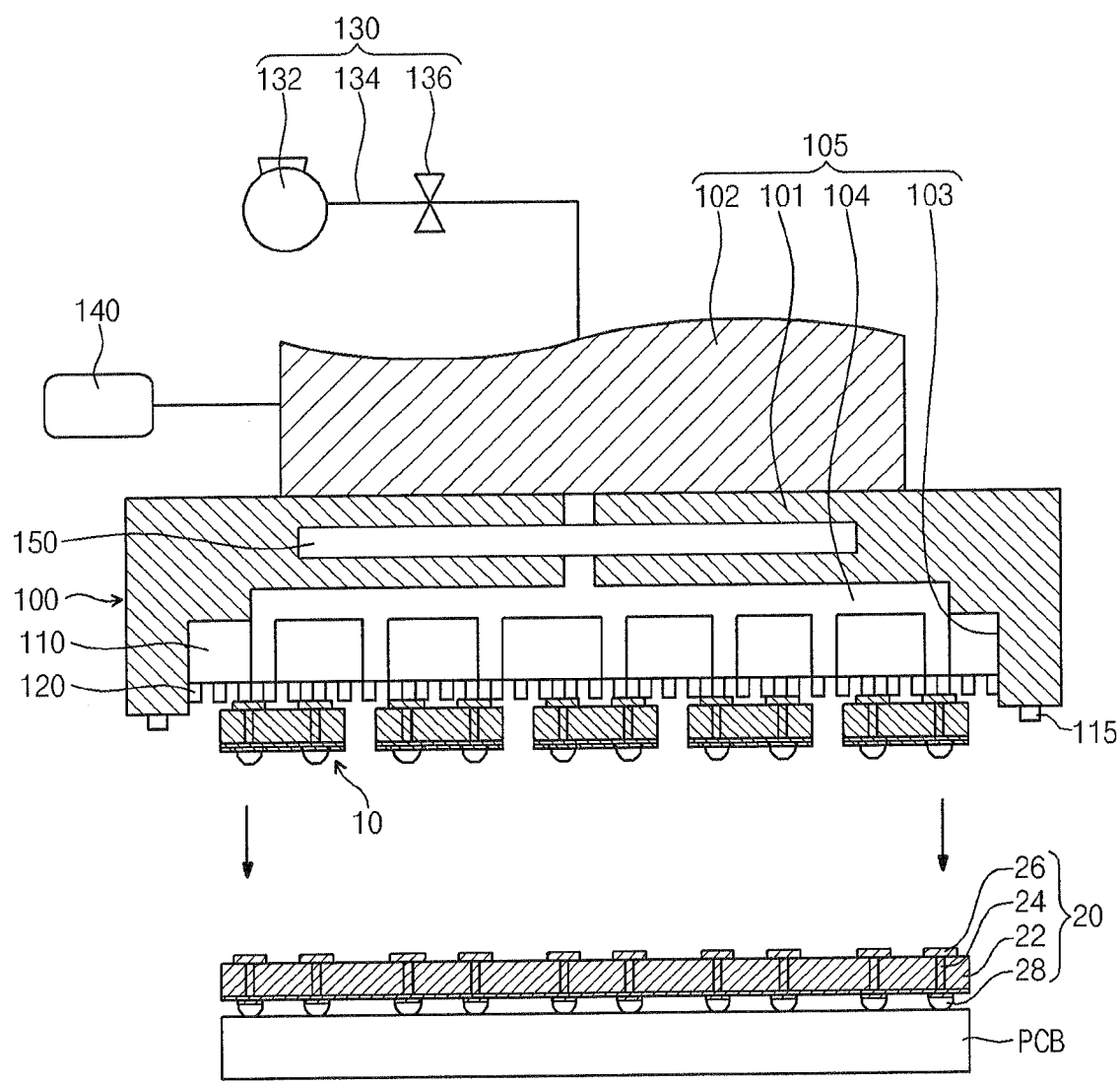

Referring to FIG. 5C, with the first chips 10 attached to the head, the head moves the first chips 10 onto a wafer 22 on which second chips 20 are formed.

In more detail, the first chips 10 are sucked to the buffer pad 120 of the head by the vacuum part 130 which is connected to vacuum holes of the body 105. According to an embodiment, the buffer pad 120 includes a flexible and/or elastic material. As a consequence, the buffer pad 120 protects the first chips 10 while the first chips 10 are attached to the buffer pad 120 in a vacuum. Further, since the buffer pad 120 have diverse patterns, such as a line-shaped pattern, a grid-shaped pattern or a mesh-shaped pattern, the vacuum part 130 produces a high vacuum between the buffer pad 120 and the first chips 10.

While the first chips 10 are moved onto the second chips 20, with the first chips 10 attached to the head, the head is flipped over under the control of the driving part 140 so that the first chips 10 face the second chips 20.

In an embodiment, the second chips 20 are not separated from each other in the wafer 22. Each of the second chips 20 includes a portion of the wafer 22, second through silicon via (TSV) electrodes 24, second chip pads 26 and second solder balls 28.

In an embodiment, the second chips 20 are separated from each other in the wafer 22. According to an embodiment, the second chips 20 are disposed and fixed on a stage. The stage has the same or substantially the same structure as the apparatus described with reference to FIGS. 1A and 1B. However, the embodiments are not limited thereto, and the apparatuses illustrated in FIGS. 2, 3A, 3B, 4A and 4B may also be used according to an embodiment.

The stage includes a chuck 100, a vacuum part 130, a driving part 140 and a heating part 150. The chuck 100 includes a body 105, a plate 110 and a buffer pad. The chuck 100 further includes alignment marks 115 disposed on edges of the body 105. By the alignment marks 115, the second chips 20 are disposed at predetermined positions, respectively, on the stage. In an embodiment, coordinates of the predetermined positions on the stage are identical or substantially identical to coordinates of the predetermined positions on the head on which the first chips 10 are loaded.

Figure 5D:
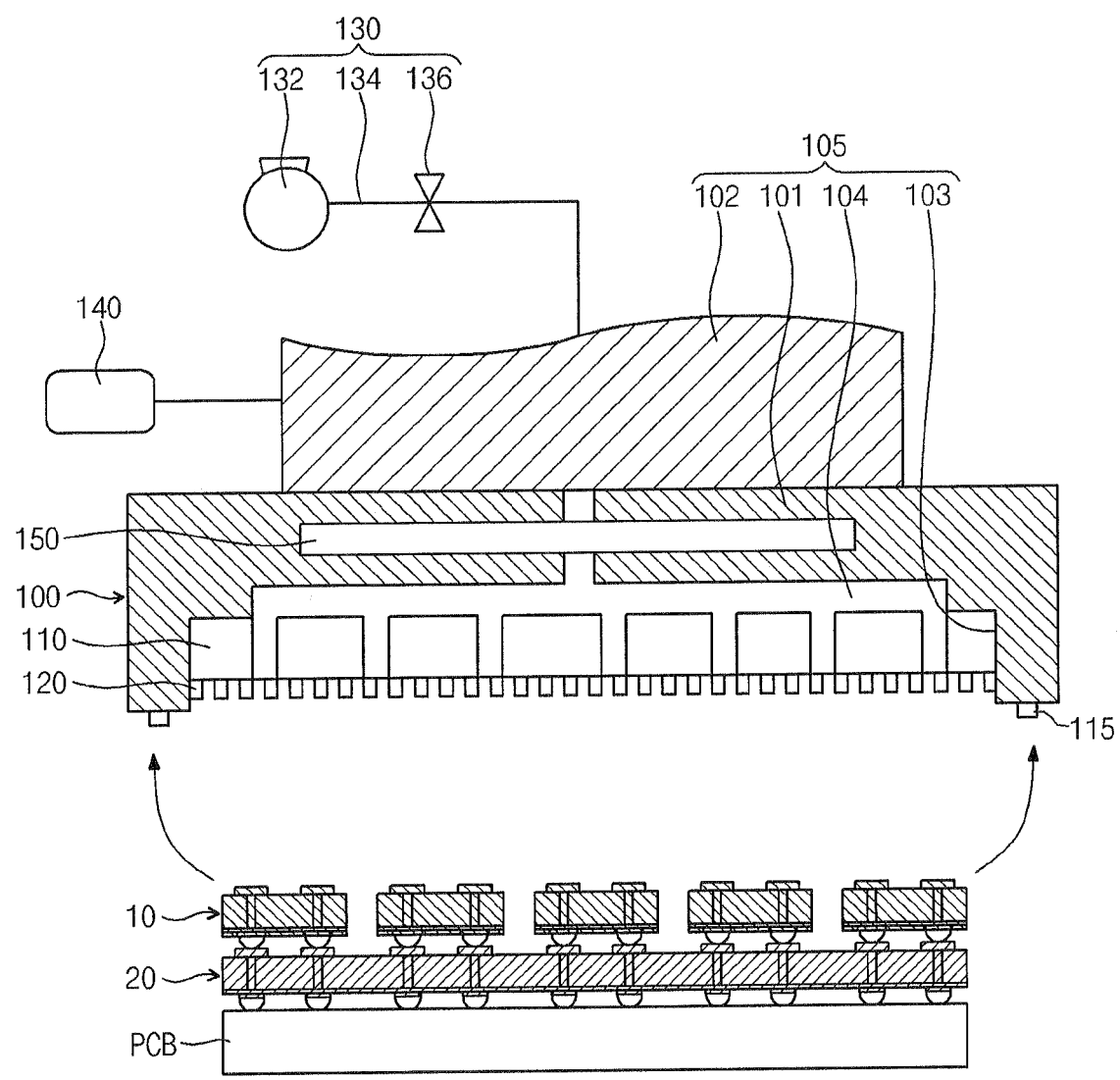

Referring to FIG. 5D, the first chips 10 contact the second chips 20 and are pressed down. The first chips 10 are heated up and are physically combined with the second chips 20. As a consequence, the first chips 10 are mounted on the second chips 20.

For example, under the control of the driving part 140, the head is moved down and presses the first chips 10 contacting the second chips 20. Heat is supplied to the first and second chips 10 and 20 by the heating part 150 of the head while the first chips 10 are pressed down. The heating part 150 heats the first and second chips 10 and 20 until the solder balls 18 and 28 and the chip pads 16 and 26 reach a melting point. As a consequence, the first chips 10 are physically combined and electrically connected with the second chips 20.

As described above, the plurality of first chips 10, arrayed and sucked onto the head, can be electrically connected to the second chips 20 at the same time. As such, the first chips 10 can be easily connected to the second chips 20. After aligned by the head using the alignment marks 115, the first chips 10 are brought in contact with the second chips 20. The first chips 10 are pressed and heated to be electrically connected to the second chips 20. Thus, any process failures, which may be attributed to a misalignment between the first and second chips 10 and 20, can be prevented.

After the first chips 10 are connected to the second chips 20, the head is separated from the first chips 10.

Figure 6A:
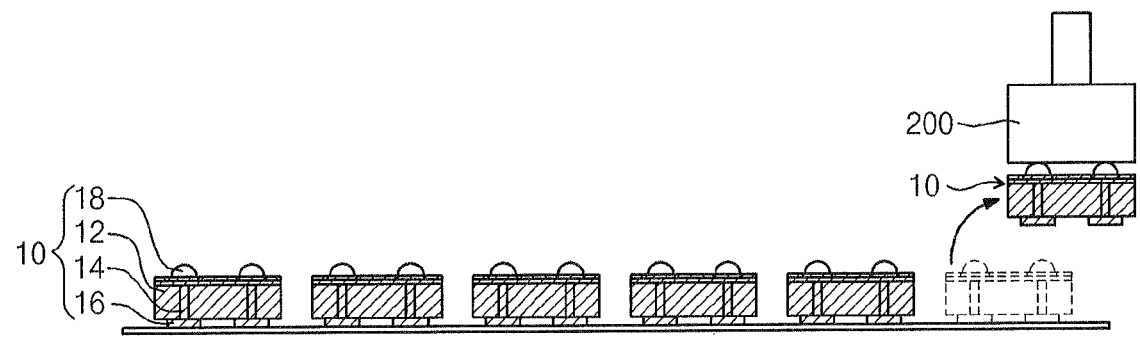
FIGS. 6A and 6C are cross sectional views illustrating a method of packaging a semiconductor device according to an embodiment.
Figure 6B:
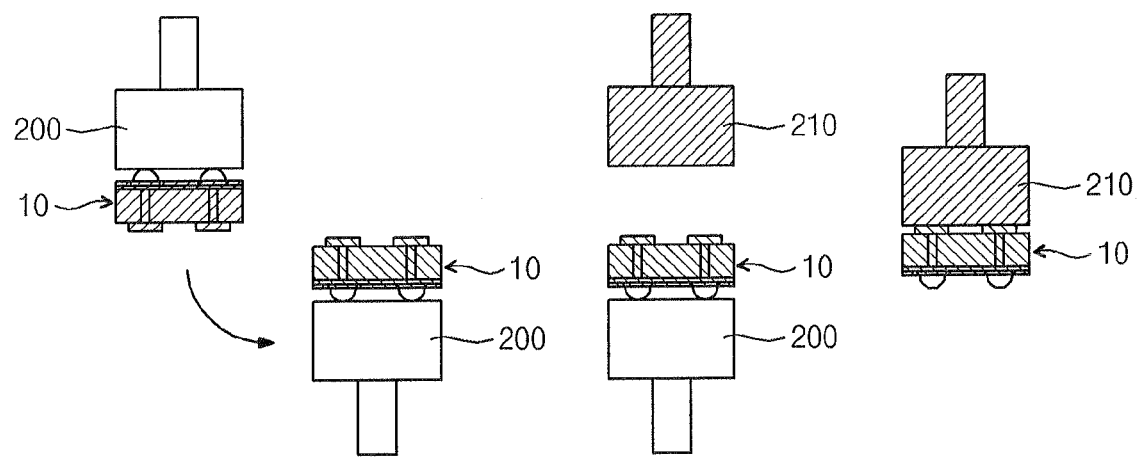
Figure 6C:
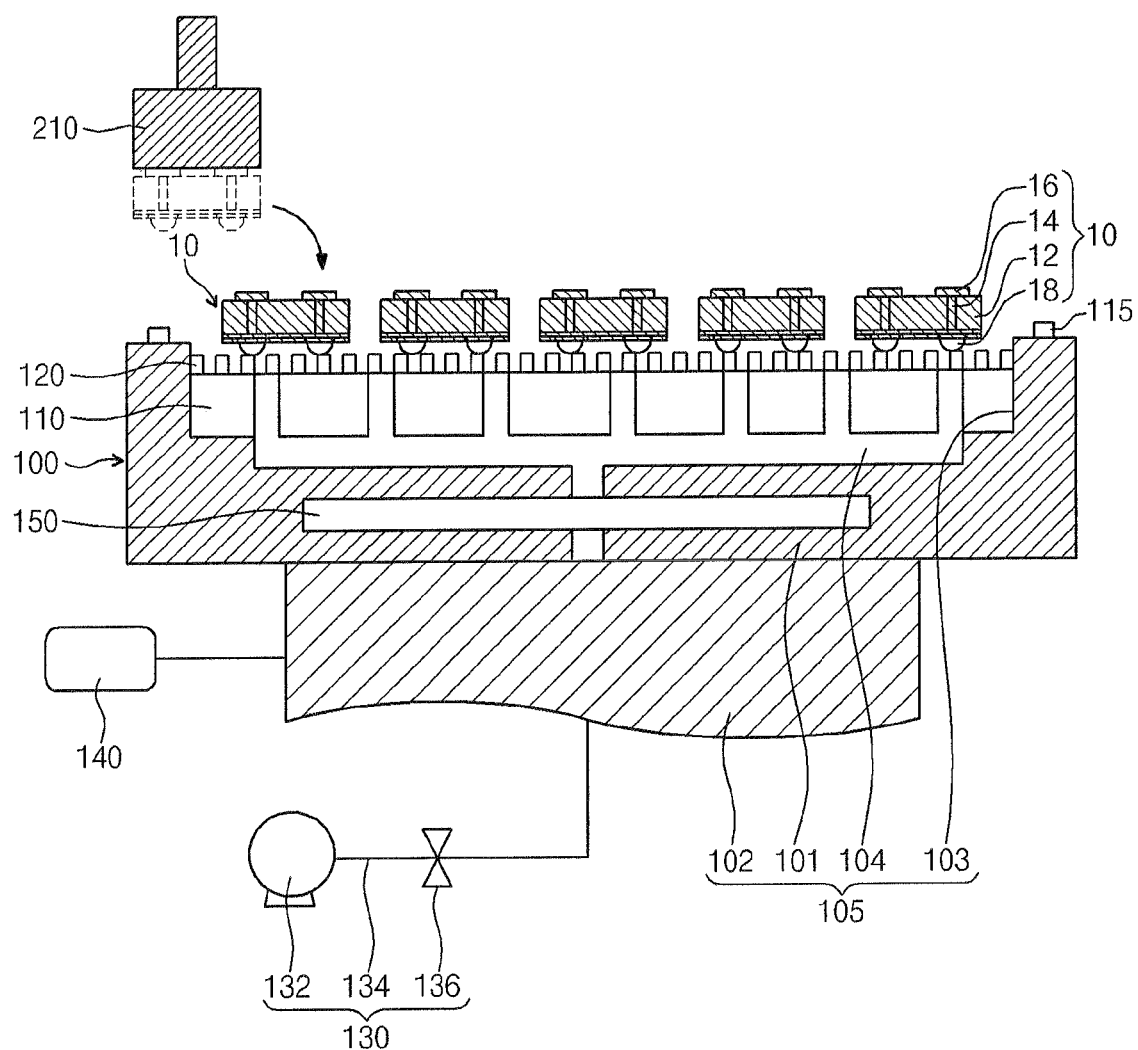

FIGS. 6A through 6C are cross sectional views illustrating a method of packaging a semiconductor device according to an embodiment of the inventive concept.

Referring to FIGS. 6A and 6B, a plurality of first chips 10 are provided, and one of the first chips 10 is sequentially attached to a first transfer unit 200 and a second transfer unit 210.

The first chips 10 have the same or substantially the same structure as the first chips 10 described with reference to FIGS. 5A and 5B. Each of the transfer units 200 and 210 includes a sucking portion for sucking one of the first chips 10 and a driving portion for flipping and/or moving the first chip 10.

In more detail, one of the first chips 10 is sucked to the first transfer unit 200. For example, the first transfer unit 200 sucks the first chip 10 so that the solder balls 18 of the first chip 10 contact the sucking portion of the first transfer unit 200. The first transfer unit 200 is then flipped over using the driving portion of the first transfer unit 200, and the second transfer unit 210 sucks the first chip 10 so that the chip pads 16 of the first chip 10 contact the sucking portion of the second transfer unit 210.

As such, the first chips 10 may be flipped by the first and second transfer units 200 and 210 to have a desired arrangement or configuration.

Referring to FIG. 6C, the first chip 10 attached to the second transfer unit 210 is loaded onto the head in the same or substantially the same manners as described with reference to FIGS. 5C and 5D. According to an embodiment, subsequent processes are performed in the same or substantially the same manners as described with reference to FIGS. 5C and 5D.

According to an embodiment, the first chips 10 are loaded on the head by the first and second transfer units 200 and 210 so that the solder balls 18 or the chip pads 16 of the first chips 10 contact the buffer pad 120 of the head.

Figure 7A:
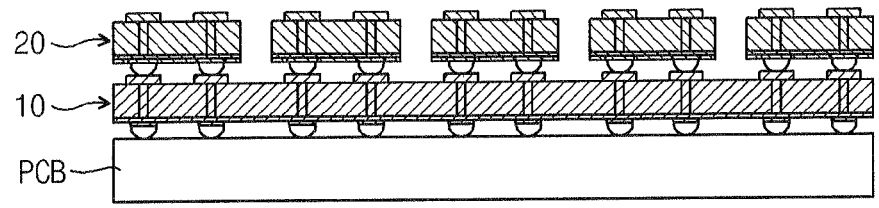
FIGS. 7A and 7B are cross sectional views illustrating a method of packaging a semiconductor device according to an embodiment.
Figure 7B:
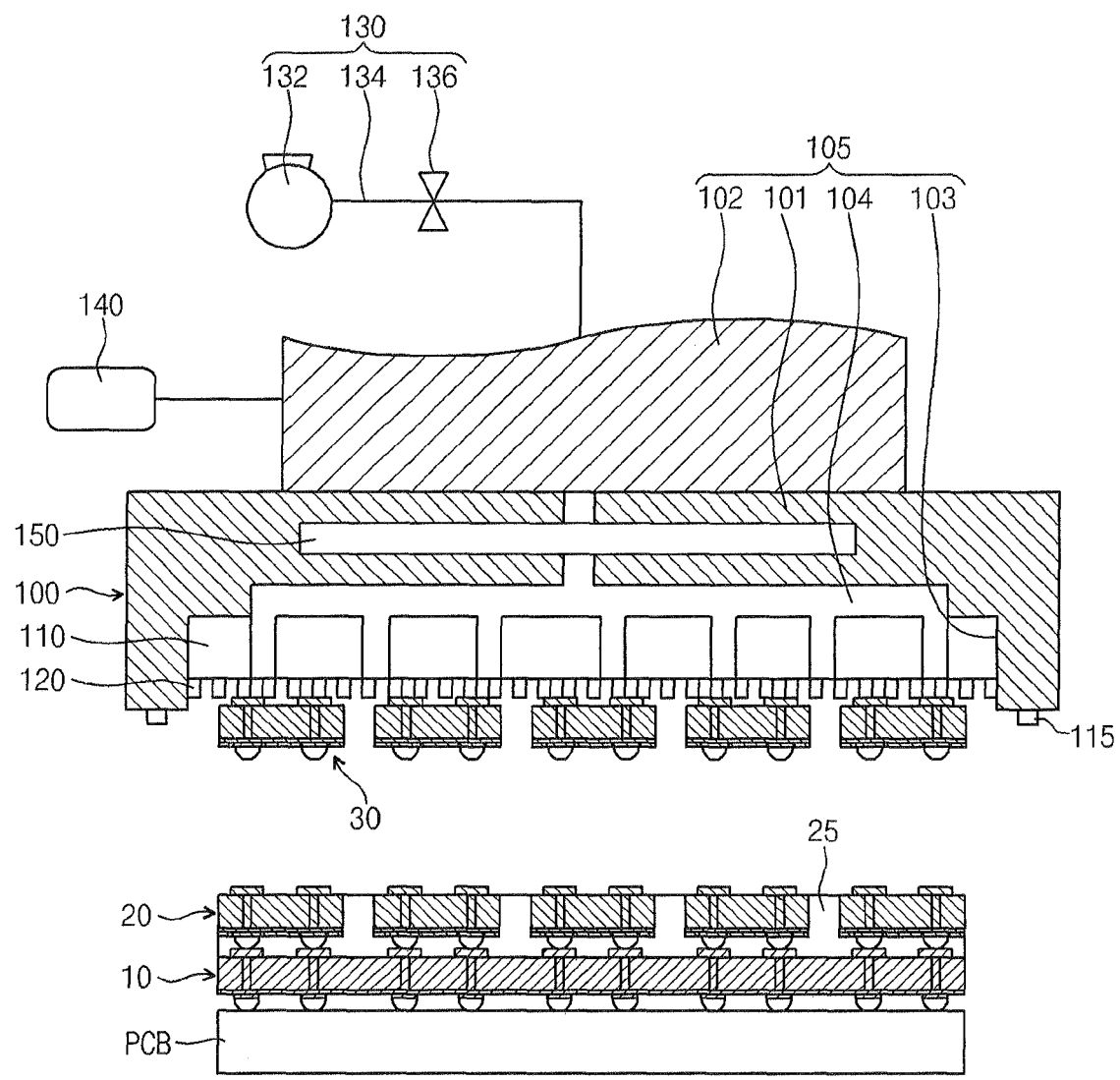

FIGS. 7A and 7B are cross sectional views illustrating a method of packaging a semiconductor device according to an embodiment of the inventive concept.

Referring to FIG. 7A, second chips 20 are mounted on a wafer including first chips 10. Processes for mounting the second chips 20 on the wafer including the first chips 10 are the same or substantially the same as those described with reference to FIGS. 5A to 5D.

Referring to FIG. 7B, a first under-fill material 25 fills spaces between the second chips 20 as well as spaces between the first and second chips 10 and 20. The first under-fill material 25 is formed of an insulating material. Third chips 30 are mounted on the second chips 20.

Processes for mounting the third chips 30 on the second chips 20 are the same or substantially the same as those described with reference to FIGS. 5A to 5D. According to an embodiment, after the third chips 30 are mounted on the second chips 20, a second under-fill material fills spaces between the third chips 30. The second under-fill material 25 is formed of an insulating material.

Figure 8A:
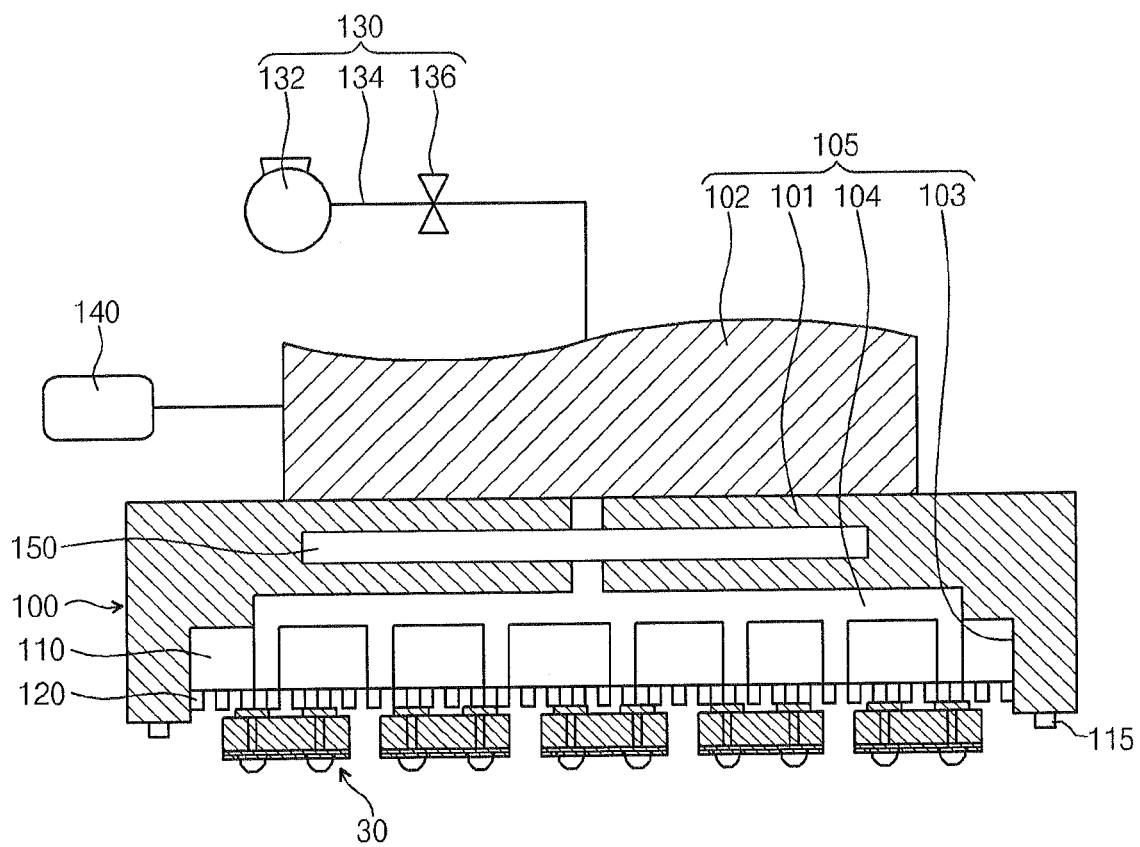
FIGS. 8A and 8B are cross sectional views illustrating a method of packaging a semiconductor device according to an embodiment.
Figure 8A:
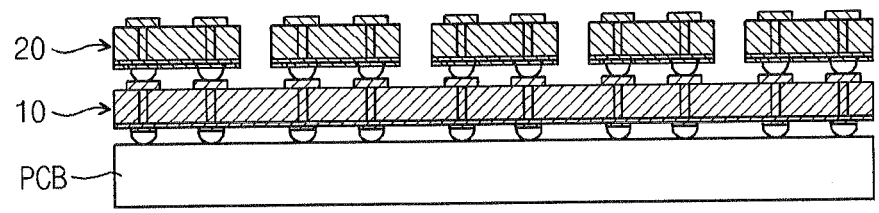
Figure 8B:
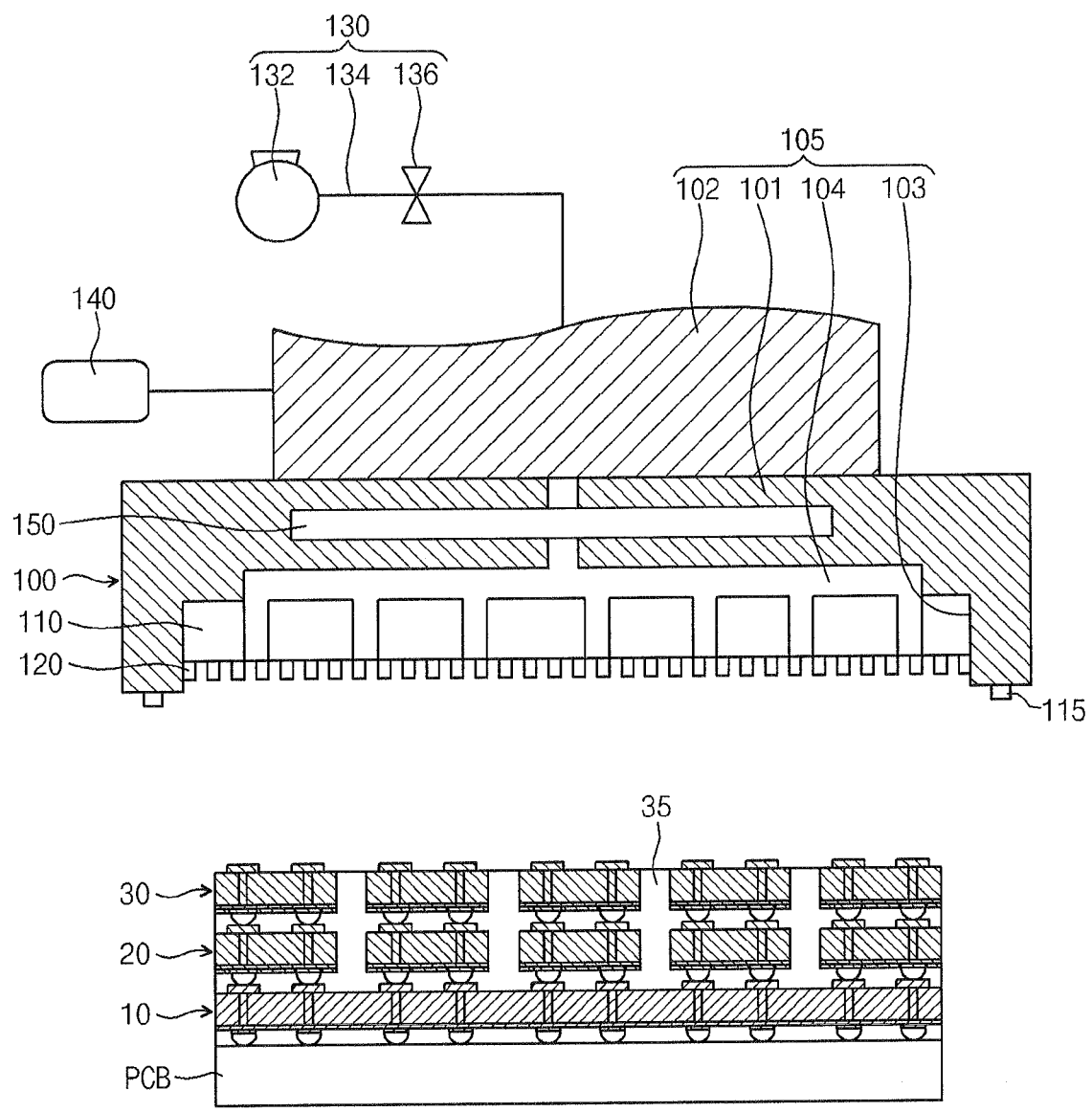

FIGS. 8A and 8B are cross sectional views illustrating a method of packaging a semiconductor device according to an embodiment of the inventive concept.

Referring to FIG. 8A, second chips 20 are mounted on a wafer including first chips 10, and third chips 30 are mounted on the second chips 20. Processes for mounting the second chips 20 on the first chips 10 and processes for mounting the third chips 30 on the second chips 20 are the same or substantially the same as those described with reference to FIGS. 5A to 5D.

Although mounting the first to third chips 10, 20 and 30 in three layers have been described, the embodiments of the inventive concept are not limited thereto, and according to an embodiment, the chips can be stacked in various numbers of layers.

Referring to FIG. 8B, an under-fill material 35 fills spaces between the first, second and third chips 10, 20 and 30. The under-fill material 35 is formed of an insulating material.

Figure 9A:
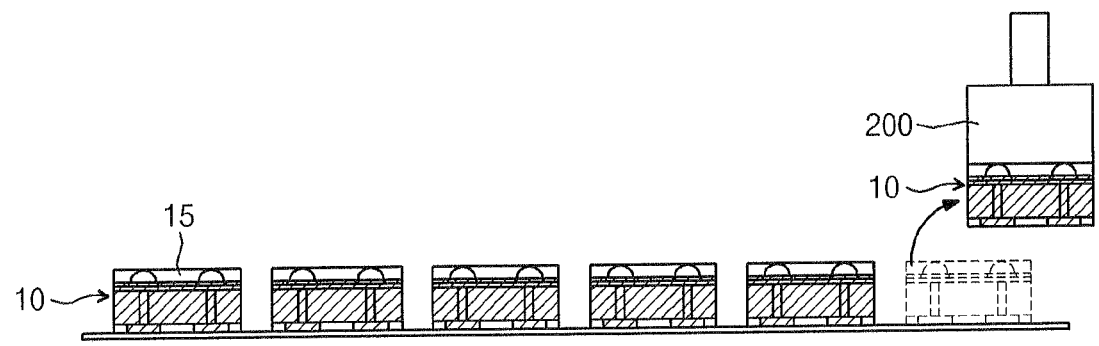
FIGS. 9A and 9B are cross sectional views illustrating a method of packaging a semiconductor device according to an embodiment.
Figure 9B:
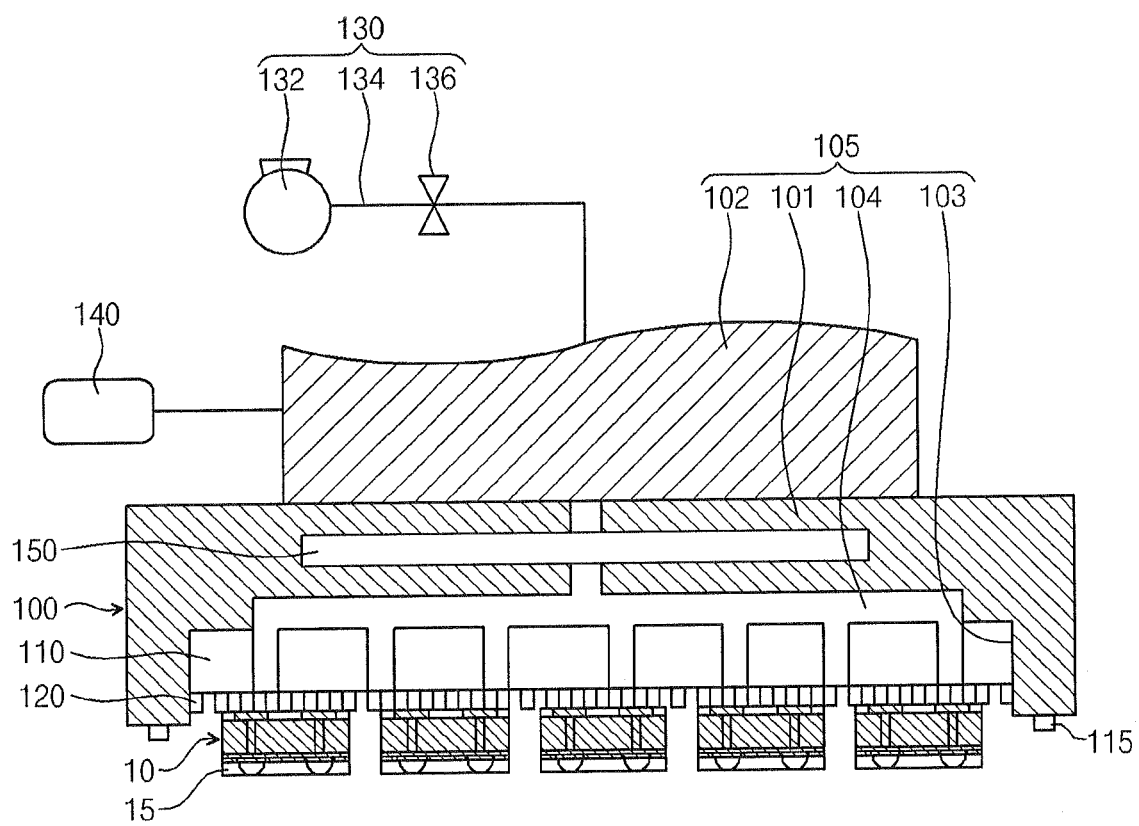

FIGS. 9A and 9B are cross sectional views illustrating a method of packaging a semiconductor device according to an embodiment of the inventive concept.

Referring to FIG. 9A, a first under-fill material 15 is formed on surfaces of first chips 10 to protect the first chips 10. The first under-fill material 15 is formed of an insulating material.

Referring to FIG. 9B, after the formation of the first under-fill material 15, the first chips 10 are transferred onto a head in the same or substantially the same manners as described with reference to FIGS. 5C and 5D. Subsequent processes are performed in the same or substantially the same manners as described with reference to FIGS. 5C and 5D.

Figure 10A:
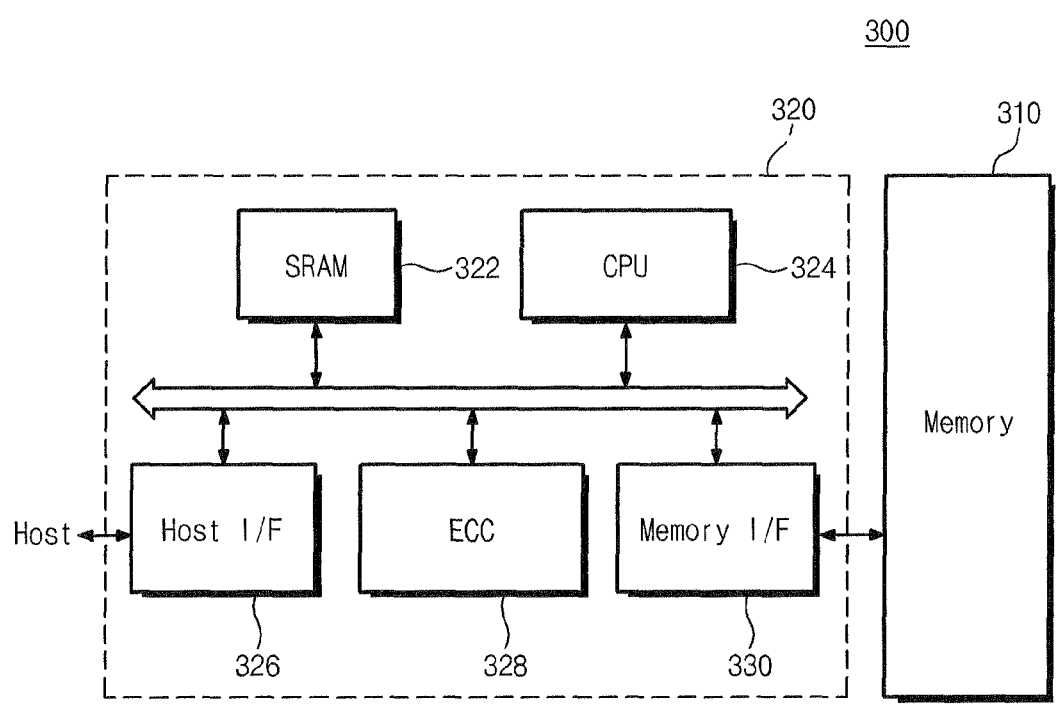
FIG. 10A is a block diagram illustrating a memory card including at least one semiconductor package according to an embodiment.

FIG. 10A is a block diagram illustrating a memory card including a semiconductor package according to an exemplary embodiment.

Referring to FIG. 10A, a semiconductor package according to an exemplary embodiment is included in a memory card 300. In an embodiment, the memory card 300 includes a memory controller 320 that controls overall data communication between a host and the memory device 310. The memory controller 320 includes a central processing unit (CPU) 324, a static random access memory (SRAM) device 322, a host interface unit 326, an error check and correction (ECC) block 328, and a memory interface unit 330. The SRAM device 322 is used as an operation memory of the CPU 324. The host interface unit 326 includes a data communication protocol of the host connected to the memory card 300. The ECC block 328 detects and corrects errors of data which are read out from the memory device 310. The memory interface unit 330 controls the communication between the memory controller 320 and the memory device 310. The central processing unit (CPU) 324 controls overall operation of the memory controller 320.

The memory device 310 of the memory card 300 includes at least one semiconductor package according to an exemplary embodiment.

Figure 10B:
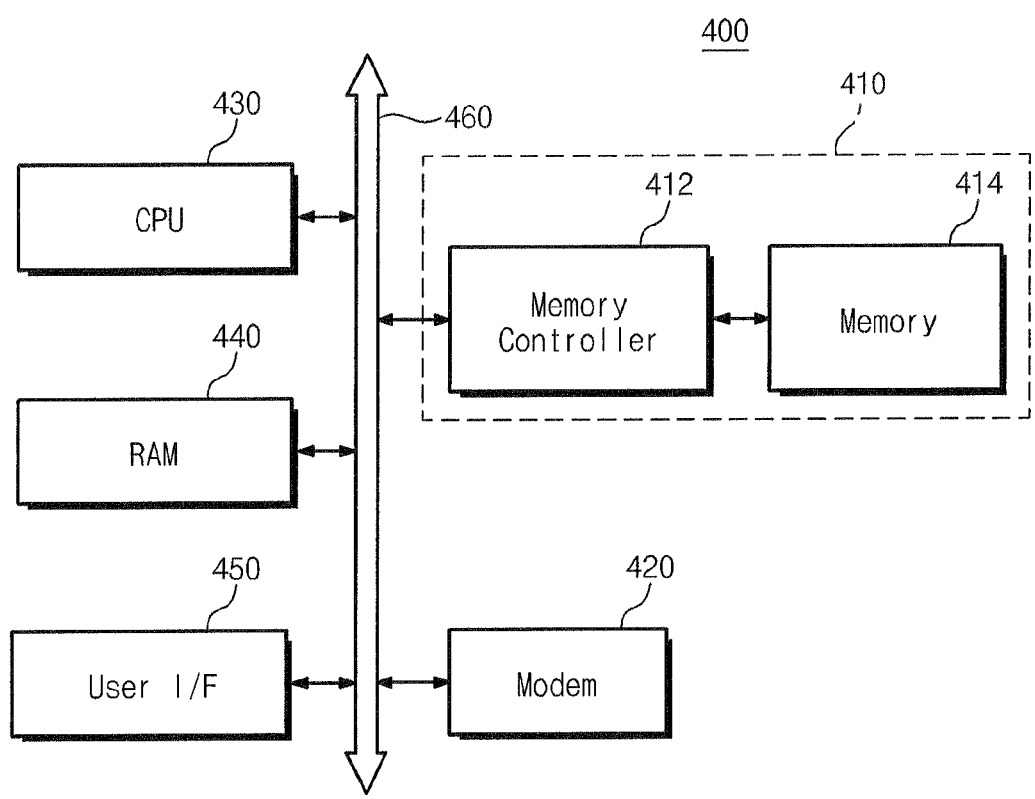
FIG. 10B is a block diagram illustrating a system including at least one semiconductor package according to an embodiment.

FIG. 10B is a block diagram illustrating an information processing system including a semiconductor package according to an exemplary embodiment.

Referring to FIG. 10B, an information processing system 400 includes a semiconductor package according to an exemplary embodiment, such as for example, a memory system 410 having a variable resistive memory device. The information processing system 400 includes a mobile system, a computer or the like. In an embodiment, the information processing system 400 includes the memory system 410, a modulator-demodulator (MODEM) 420, a central processing unit (CPU) 430, a random access memory (RAM) device 440 and a user interface unit 450 that communicate with each other through a data bus 460. The memory system 410 stores data processed by the CPU 430 or data transmitted from an external system. The memory system 410 includes a memory device 412 and a memory controller 412. The memory system 410 has the same or substantially the same configuration as the memory card 300 illustrated in FIG. 10A. According to an embodiment, the information processing system 400 is applied to a memory card, a solid state disk, a camera image processor or an application chipset. For example, the memory system 410 corresponds to the solid state disk. The memory system 410 of the information processing system 400 stably and reliably stores a large capacity of data.

According to the embodiments set forth above, an apparatus including a vacuum part and a buffer pad having elasticity is used as a head or stage. As a result, a plurality of chips are electrically connected to each other at the same time. Lower chips of the plurality chips can be fixed on the stage by the vacuum part to be prevented from laterally slipping during a bonding process. After aligned with the head, upper chips of the plurality of chips can be mounted on the lower chips. As a consequence, any failures, which may be attributed to a misalignment between the lower and upper chips, can be prevented.

While the embodiments of the inventive concept have been described, it will be apparent to those skilled in the art that various changes and modifications may be made without departing from the spirit and scope of the embodiments of the inventive concept. Therefore, it should be understood that the above embodiments are not limiting, but illustrative. Thus, the scope of the embodiments of the inventive concept is to be determined by the broadest permissible interpretation of the following claims and their equivalents, and shall not be restricted or limited by the foregoing description.

What is claimed is:

1. An apparatus comprising:
a chuck having a body, a porous plate disposed on the body, and a buffer pad disposed on the plate, the buffer pad configured to receive a plurality of semiconductor chips;

a vacuum part supplying vacuum to the chuck, the vacuum part configured to supply a vacuum to act upon the plurality of semiconductor chips;

a driving part configured to move the chuck; and a heating part in the chuck.

2. The apparatus of claim 1, wherein the buffer pad has elasticity greater than elasticity of the plate.

3. The apparatus of claim 1, wherein the body includes, an upper portion including a groove in which the plate and the buffer pad are sequentially stacked; and a lower portion extending downward from the upper portion.

4. An apparatus comprising:

a chuck having a body, a porous plate disposed on the body, and a buffer pad disposed on the plate, the buffer pad configured to receive a plurality of semiconductor chips; and a vacuum part supplying vacuum to the chuck, the vacuum part configured to supply a vacuum to act upon the plurality of semiconductor chips, wherein the buffer pad includes a plurality of line-shaped patterns parallel with each other.

5. The apparatus of claim 4, wherein the plurality of line-shaped patterns include first line-shaped patterns parallel with each other and second line-shaped patterns parallel with each other, wherein the first line-shaped patterns extend in a first direction, and the second line-shaped patterns extend in a second direction.

6. The apparatus of claim 4, wherein the plurality of line-shaped patterns respectively correspond to chip pads or solder balls of the plurality of semiconductor chips.

7. An apparatus comprising:

a chuck having a body, a porous plate disposed on the body, and a buffer pad disposed on the plate, the buffer pad configured to receive a plurality of semiconductor chips; and a vacuum part supplying vacuum to the chuck, the vacuum part configured to supply a vacuum to act upon the plurality of semiconductor chips, wherein the buffer pad includes a heat resistant rubber material or an engineering plastic material, and the porous plate includes an alumina material, a mulite material, a ceramic material or a silicon carbide material.

8. The apparatus of claim 1, wherein the chuck further includes alignment marks on the body.

9. An apparatus comprising:

a chuck having one or more alignment marks and a buffer pad, the buffer pad configured to receive one or more chips, wherein the chips are aligned on the buffer pad based on the alignment marks;

a vacuum part connected to the chuck, the vacuum part configured to generate a vacuum to act upon the chips;

a driving part configured to move the chuck; and a heating part configured to heat the chips.

10. The apparatus of claim 9, wherein the buffer pad includes a plurality of line-shaped patterns.

11. The apparatus of claim 9, wherein the buffer pad includes first line-shaped patterns extending in a first direction and second line-shaped patterns extending in a second direction.

12. The apparatus of claim 9, wherein the buffer pad includes a plurality of patterns respectively corresponding to chip pads or solder balls of the one or more chips.

13. An apparatus comprising:

a chuck having a body, a porous plate disposed on the body, and a buffer pad disposed on the plate, the buffer pad configured to receive a plurality of semiconductor chips;

a driving part configured to move the chuck;

a heating part in the chuck; and a vacuum part supplying vacuum to the chuck, the vacuum part configured to supply a vacuum to act upon the plurality of semiconductor chips, wherein the body includes an upper portion including a groove in which the plate and the buffer pad are sequentially stacked, and a lower portion extending downward from the upper portion, and wherein a top surface of the buffer pad is lower than a top surface of the body.

14. The apparatus of claim 13, wherein the buffer pad has an elasticity greater than an elasticity of the plate.

15. The apparatus of claim 13, wherein the chuck further includes alignment marks on the body.

16. The apparatus of claim 13, wherein the buffer pad includes a plurality of line-shaped patterns.

17. The apparatus of claim 13, wherein the buffer pad includes first line-shaped patterns extending in a first direction and second line-shaped patterns extending in a second direction.

18. The apparatus of claim 13, wherein the buffer pad includes a plurality of patterns respectively corresponding to chip pads or solder balls of at least one semiconductor chip, from among the plurality of semiconductor chips.

* * * * *